(12) United States Patent
Kollodge

(10) Patent No.: US 7,435,162 B2
(45) Date of Patent: Oct. 14, 2008

(54) POLISHING FLUIDS AND METHODS FOR CMP

(75) Inventor: Jeffrey S. Kollodge, West Lakeland, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 11/256,736

(22) Filed: Oct. 24, 2005

(65) Prior Publication Data

US 2007/0093182 A1    Apr. 26, 2007

(51) Int. Cl.
B24B 1/00 (2006.01)
(52) U.S. Cl. .................. 451/41; 438/692; 156/345.12; 252/79.5
(58) Field of Classification Search .................. 451/36, 451/41; 252/79.5; 257/E21.304; 438/692; 156/345.12
See application file for complete search history.

(56) References Cited

U.S. PATENT DOCUMENTS

| | | | |
|---|---|---|---|
| 3,341,384 A | 9/1967 | Alderuccio et al. | |
| 3,754,878 A | 8/1973 | Burke | |
| 3,756,957 A | 9/1973 | Shiga | |
| 3,877,938 A | 4/1975 | Shinozaki et al. | |
| 4,130,454 A | 12/1978 | Dutkewych et al. | |
| 4,954,142 A | 9/1990 | Carr et al. | |
| 4,987,099 A | 1/1991 | Flanner | |
| 5,014,468 A | 5/1991 | Ravipati et al. | |
| 5,084,071 A | 1/1992 | Nenadic et al. | |
| 5,354,490 A | 10/1994 | Yu et al. | |
| 5,453,312 A | 9/1995 | Haas et al. | |
| 5,454,844 A | 10/1995 | Hibbard et al. | |
| 5,527,423 A | 6/1996 | Neville et al. | |
| 5,692,950 A | 12/1997 | Rutherford et al. | |
| 5,700,383 A | 12/1997 | Feller et al. | |
| 5,770,095 A | 6/1998 | Sasaki et al. | |
| 5,820,450 A | 10/1998 | Calhoun | |
| 5,897,375 A | 4/1999 | Watts et al. | |
| 5,958,288 A | 9/1999 | Mueller et al. | |
| 5,958,794 A | 9/1999 | Bruxvoort et al. | |
| 5,980,775 A | 11/1999 | Grumbine et al. | |
| 6,068,787 A | 5/2000 | Grumbine et al. | |
| 6,194,317 B1 | 2/2001 | Kaisaki et al. | |
| 6,206,756 B1 | 3/2001 | Chopra et al. | |
| 6,238,592 B1 | 5/2001 | Hardy et al. | |
| 6,273,786 B1 | 8/2001 | Chopra et al. | |
| 6,362,104 B1 | 3/2002 | Wang et al. | |
| 6,435,947 B2 | 8/2002 | Mueller et al. | |
| 6,436,811 B1 | 8/2002 | Wake et al. | |
| 6,546,939 B1 | 4/2003 | Small | |
| 6,589,439 B2 | 7/2003 | Honda et al. | |
| 6,612,916 B2 | 9/2003 | Kollodge et al. | |
| 6,630,433 B2 | 10/2003 | Zhang et al. | |
| 6,699,299 B2 | 3/2004 | Sachan et al. | |
| 6,811,583 B2 | 11/2004 | Ishibashi | |
| 6,849,099 B2 | 2/2005 | Ohno et al. | |
| 2002/0068454 A1 | 6/2002 | Sun et al. | |
| 2002/0104764 A1 | 8/2002 | Banerjee et al. | |
| 2002/0111024 A1 | 8/2002 | Small et al. | |
| 2003/0164471 A1 | 9/2003 | Small et al. | |
| 2003/0171072 A1 | 9/2003 | Ward et al. | |
| 2003/0178320 A1 | 9/2003 | Liu et al. | |
| 2003/0181342 A1 | 9/2003 | Seijo et al. | |
| 2003/0181345 A1 | 9/2003 | Bian | |
| 2003/0216049 A1 | 11/2003 | Sun et al. | |
| 2003/0234184 A1 | 12/2003 | Liu et al. | |
| 2004/0077295 A1 | 4/2004 | Hellring et al. | |
| 2004/0092102 A1* | 5/2004 | Li et al. ...................... | 438/689 |
| 2004/0108302 A1 | 6/2004 | Liu et al. | |
| 2004/0229461 A1 | 11/2004 | Darsillo et al. | |
| 2005/0090104 A1 | 4/2005 | Yang et al. | |

FOREIGN PATENT DOCUMENTS

| EP | 0 846 742 A2 | 6/1998 |
|---|---|---|
| EP | 0 896 042 B1 | 2/2005 |
| GB | 2 375 116 A | 11/2002 |
| JP | 2002-294225 | 10/2002 |
| WO | WO 98/23408 | 6/1998 |
| WO | WO 98/49723 | 11/1998 |

OTHER PUBLICATIONS

Leidheiser, Jr., "The Corrosion of Copper, Tin, and Their Alloys", John Wiley and Sons, Inc., The Electrochemical Society, Inc., New York, NY, pp. 119-123 (1971).

Tonshoff et al., "Abrasive Machining of Silicon", Annals of the International Institution for Production Engineering Research, vol. 39/2, pp. 621-635, (1990).

Kaufman et al., "Chemical-Mechanical Polishing for Fabricating Patterned W Metal Features as Chip Interconnects", *J. Electrochem. Soc.*, vol. 138, No. 11, pp. 3460-3465, Nov. 1991.

(Continued)

*Primary Examiner*—Eileen P. Morgan
(74) *Attorney, Agent, or Firm*—Dean M. Harts; James A. Baker

(57) ABSTRACT

Provided are several polishing compositions useful for modifying a surface, such as a semiconductor wafer suitable for fabrication of a semiconductor device, especially when used in fixed abrasive planarization techniques. The polishing compositions include a synergistic mixture of water, an oxidizing agent, a complexing agent, and metal ions. Also provided are various methods of surface planarization.

9 Claims, No Drawings

OTHER PUBLICATIONS

Literature, DuPont, "Oxon® Monopersulfate Compound", 1994.
Farkas et al., "Oxidation and Etching of Tungsten in CMP Slurries", pp. 25-32, Materials Research Society 1995.
Printed Circuits Handbook, Clyde F. Coombs, Jr., Editor, Fourth Edition, pp. 21.5-21.23, 1995.
Literature, Cabot, General Information on SEMI-SPERSE™ W-A355 Polishing Slurry for Tungsten CMP, 1995.
Literature, Cabot, SEMI-SPERSE™ W-A355 Polishing Slurry for Tungsten CMP, 1995.
Literature, Cabot, "SEMI-SPERSE™ FE-10 Oxidizer Solution for Tungsten CMP", 1995.
Kim et al., "Self-Conditioning Fixed Abrasive Pad in CMP", Journal of the Electrochemical Society, 151 (12), pp. G858-G862 (2004).

* cited by examiner

POLISHING FLUIDS AND METHODS FOR CMP

TECHNICAL FIELD

This invention relates generally to a method of modifying exposed surfaces of semiconductor wafers and particularly to a method of modifying exposed surfaces of structured semiconductor wafers using an abrasive article, as well as solutions useful in polishing semiconductor wafers.

BACKGROUND

During integrated circuit manufacture, semiconductor wafers used in semiconductor fabrication typically undergo numerous processing steps, including deposition, patterning, and etching steps. Details of these manufacturing steps for semiconductor wafers are reported by Tonshoff, et al., "Abrasive Machining of Silicon", published in the Annals of the International Institution for Production Engineering Research, (Vol. 39/2/1990), pp. 621-635. In each manufacturing step, it is often necessary or desirable to modify or refine an exposed surface of the wafer in order to prepare the wafer for subsequent fabrication or manufacturing steps.

For example, after a deposition step, the deposited material or layer on a wafer surface generally needs further processing before additional deposition or subsequent processing occurs. In another example, after an etching step, there is often a need to deposit either, or both, conducting or insulating materials in layers on the etched surface areas of a wafer. A specific example of this process is used in metal Damascene processes.

In the Damascene process, a pattern is etched into an oxide dielectric layer. After etching, optional adhesion/barrier layers are deposited over the entire surface and then a metal is deposited over or on top of the adhesion/barrier layers. The deposited metal layer is then modified, refined or finished by removing the deposited metal and regions of the adhesion/barrier layer on the surface. Typically, enough surface metal is removed so that the outer exposed surface of the wafer comprises both metal and an oxide dielectric material. A top view of the exposed wafer surface should reveal a planar surface with metal corresponding to the etched pattern and dielectric material adjacent to the metal. The metal(s) and oxide dielectric material(s) located on the modified surface of the wafer inherently have different physical characteristics, such as different hardness values. An abrasive article used to modify a wafer produced by the Damascene process must be carefully designed so as to simultaneously modify the materials without scratching the surface of either material. Further, the abrasive article must be able to create a planar outer exposed surface on a wafer having an exposed area of a metal and an exposed area of a dielectric material.

Such a process of modifying the deposited metal layer until the oxide dielectric material is exposed on the wafer outer surface leaves little margin for error because of the submicron dimensions of the metal features located on the wafer surface. It is clear that the removal rate of the deposited metal must be fast to minimize manufacturing costs. Further, metal removal from areas which were not etched must be complete. Still further, metal remaining in etched areas must be limited to discrete areas or zones, and the remaining metal must be continuous within an area or zone to ensure proper conductivity. In short, the metal modification process must be uniform, controlled, and reproducible on a submicron scale.

One conventional method of modifying or refining exposed surfaces of wafers employs methods that treat a wafer surface with a slurry containing a plurality of loose abrasive particles dispersed in a liquid. Typically this slurry is applied to a polishing pad and the wafer surface is then ground or moved against the pad in order to remove or take off material on the wafer surface. Generally, the slurry also contains agents which chemically react with the wafer surface. This type of process is commonly referred to as a chemical-mechanical planarization or polishing (CMP) process.

One problem with CMP slurries, however, is that the process must be carefully monitored in order to achieve a desired wafer surface topography. Another problem is the mess associated with loose abrasive slurries. Another problem is that the slurries generate a large number of particles that must be removed from the surface of the wafer and disposed of following wafer treatment. Handling and disposal of these slurries involves additional processing costs for the semiconductor wafer fabricator.

SUMMARY OF THE INVENTION

The present invention exploits the advantages afforded by use of abrasive articles to modify surfaces of semiconductor wafers to expose at least two different materials on the surface of a wafer. These materials typically have different hardness values and different abrading properties.

The present invention involves a recent alternative to CMP slurry methods and uses an abrasive article to modify or refine a semiconductor surface. This alternative CMP process is reported in U.S. Pat. Nos. 5,958,794 and 6,194,317, the disclosures of which are herein incorporated by reference. The useful abrasive article has a textured abrasive surface that includes abrasive particles dispersed in a binder. In use, the abrasive article is contacted with a semiconductor wafer surface, often in the presence of a fluid or liquid, with a motion adapted to modify an exposed surface region of material on the wafer and provide a planar, uniform wafer surface. Using these fixed abrasive articles overcomes a significant number of problems associated with CMP slurries.

Briefly, the present invention provides a fixed abrasive chemical mechanical polishing or planarization composition useful for modifying a surface of a wafer, the composition comprising a synergistic mixture of water, an oxidizing agent, a complexing agent, and metal ions. When a majority of the complexing agent is selected from a simple monofunctional or simple difunctional acid or salt thereof, the mole ratio of complexing agent to metal ions present in the liquid is at least 3 to 1. The mixture also is substantially free of abrasive particles.

In another embodiment, the present invention provides a chemical mechanical polishing system comprising a fixed abrasive pad and a polishing composition useful for modifying a surface of a wafer, the composition comprising a synergistic mixture of water, an oxidizing agent, a complexing agent, and metal ions. When a majority of the complexing agent is a simple monofunctional or simple difunctional acid or salt thereof, the mole ratio of complexing agent to metal ions present in the liquid is at least 3 to 1. In addition, the mixture is substantially free of abrasive particles.

In one embodiment of this invention, a method of modifying a wafer may begin with a layer comprised of conductive material deployed over at least one dielectric material. The dielectric material typically has a surface etched to form a design, i.e., a patterned surface. Such a wafer may be modified by contacting and relatively moving the exposed major surface of the wafer (e.g., exposed conductive material) with respect to the abrasive article. The abrasive article typically comprises an exposed major surface of a plurality of textured, three-dimensional abrasive composites comprising a plurality of abrasive particles fixed and dispersed in a binder. This contact and motion typically is maintained between the plurality of abrasive composites of the abrasive article and the conductive material until an exposed surface of the wafer is substantially planar and the surface comprises at least one area of exposed conductive material and at least one area of exposed dielectric material, and the exposed surfaces of conductive material and the exposed surfaces of dielectric material lies substantially in a single plane. The dielectric material may be covered by one or more intermediate materials such as an adhesion/barrier layer. Typically, the exposed dielectric material surface is essentially free of the intermediate material after removal of the conductive material. Alternatively, removal of the conductive material may expose only the surface of the intermediate material and the conductive material. Continued modification may then expose on the surface of the wafer the dielectric material and the conductive material, when desired.

The present method is particularly suitable for modifying conductive surfaces, often referred to as the second material in this document. The conductive surfaces may be made from a variety of conductive materials generally having resistivity values of less than about 0.1 ohm-cm. Presently preferred conductive materials include metals such as tungsten, copper, aluminum, aluminum copper alloy, gold, silver, titanium, titanium nitride, ruthenium or various alloys of these metals. Preferred dielectric materials generally have dielectric constants less than about 5.

In another aspect, the present invention provides methods of modifying a surface of a semiconductor wafer suited for fabrication of a semiconductor device. A method of the invention comprises providing a wafer comprising at least a first material having a surface etched to form a pattern and at least a second material deployed over the surface of the first material, contacting the second material of the wafer to a plurality of three-dimensional abrasive composites fixed to an abrasive article in the presence of a working liquid as described herein, wherein the abrasive composites comprise a plurality of abrasive particles fixedly dispersed in a binder, and relatively moving the wafer while the second material is in contact with the plurality of abrasive composites until an exposed surface of the wafer is substantially planar and comprises at least one area of exposed first material and one area of exposed second material.

Another method of the invention comprises providing a wafer comprising at least one dielectric material having a surface etched to form a pattern and at least one conductive material deployed over the surface of the at least one dielectric material, contacting the conductive material of the wafer to a plurality of three-dimensional abrasive composites fixed to an abrasive article in the presence of a working liquid as described herein, wherein the plurality of abrasive composites comprise a plurality of abrasive particles, fixed and dispersed in a binder, and relatively moving the wafer while the conductive material is in contact with the plurality of abrasive composites until the exposed surface of the wafer is substantially planar and comprises at least one area of exposed conductive material and at least one area of exposed dielectric material.

The methods of the invention also include providing a wafer comprising at least one dielectric material having a patterned surface, the dielectric material substantially covered with at least one intermediate layer, and the intermediate layer substantially covered by at least one conductive material, contacting the conductive material of the wafer to a plurality of three-dimensional abrasive composites, which are fixed to an abrasive article, in the presence of a working liquid as described herein, wherein the plurality of abrasive composites comprise a plurality of abrasive particles fixed and dispersed in a binder, and relatively moving the wafer while the conductive material is in contact with the plurality of abrasive composites until the exposed surface of the wafer comprises at least one area of exposed conductive material and at least one area of exposed intermediate layer or at least one area of exposed dielectric material. The intermediate layer can be, for example, a stop layer, or a conductive layer.

With the present invention, the combination of the metal ion and the other components in the inventive polishing composition (also known as a working liquid) provides a synergistic response of an improved removal rate of the conductive metal surface, allowing for the use of reduced oxidizer concentrations and low metal ion concentrations. Lower oxidizer concentration in the working liquid is preferred because the lower levels, generally, minimize corrosion of the conductive metal surfaces during CMP processing. Lower metal ion concentrations are preferred to minimize wafer surface contamination by the metal ions. Generally, the synergistic response provides better removal rate than a subset of the components or a linear interpolation of the removal rates for a subset of the components. Also, it is beneficial to include a complexing agent to the working liquid or polishing composition, to not only enhance removal rates, but also to prevent premature decomposition of the oxidizing agent (extending the pot life of the mixture). A particularly useful embodiment of this invention is combining the use of a fixed abrasive pad with an essentially abrasive free polishing composition. This combination provides excellent metal surface removal rates while yielding low dishing and low erosion.

One advantage of the present invention provides a fixed abrasive CMP process with a working fluid, also called a polishing fluid, useful for tungsten CMP. Other features and advantages of the invention will be apparent from the following detailed description of the invention and the claims. The above summary of principles of the disclosure is not intended to describe each illustrated embodiment or every implementation of the present disclosure. The detailed description that follows more particularly exemplifies certain preferred embodiments using the principles herein.

DETAILED DESCRIPTION

All numbers are herein assumed to be modified by the term "about." The recitation of numerical ranges by endpoints includes all numbers subsumed within that range (e.g., 1 to 5 includes 1, 1.15, 2, 2.75, 3, 3.80, 4, and 5).

It was found that CPS-11 (from 3M Company, and intended for copper polishing) does not remove tungsten at acceptable removal rates under a broad range of process conditions and oxidizer concentrations. Hence, a different polishing solution was sought for fixed abrasive CMP for tungsten. The present invention provides several solutions.

In one embodiment, the present invention provides a fixed abrasive chemical mechanical polishing composition useful for modifying a surface of a wafer, the composition comprising a synergistic mixture of water, an oxidizing agent, a complexing agent, and metal ions. When a majority of the complexing agent is selected from a simple monofunctional acid, a simple difunctional acid, a salt thereof, or a combination thereof, the mole ratio of complexing agent to metal ions present in the liquid is at least 3 to 1. The mixture also is substantially free of abrasive particles.

The polishing fluids, or working fluids, or compositions, of the invention can be used in any known method of CMP, and are known to be particularly useful in fixed abrasive CMP. More particularly, the polishing fluids of the present invention are useful in tungsten CMP. Thus, the present invention provides methods of modifying a surface of a semiconductor wafer suited for fabrication of a semiconductor device, such as fixed abrasive CMP. A method of the invention comprises providing a wafer comprising at least a first material having a surface etched to form a pattern (patterned surface) and at least a second material deployed over the surface of the first material, contacting the second material of the wafer to a plurality of three-dimensional abrasive composites fixed to an abrasive article in the presence of a working liquid as described herein, wherein the abrasive composites comprise a plurality of abrasive particles fixedly dispersed in a binder, and relatively moving the wafer while the second material is in contact with the plurality of abrasive composites until an exposed surface of the wafer is substantially planar and comprises at least one area of exposed first material and one area of exposed second material.

Another method of the invention comprises providing a wafer comprising at least one dielectric material having a surface etched to form a pattern and at least one conductive material deployed over the surface of the at least one dielectric material, contacting the conductive material of the wafer to a plurality of three-dimensional abrasive composites fixed to an abrasive article in the presence of a working liquid as described herein, wherein the plurality of abrasive composites comprise a plurality of abrasive particles, fixed and dispersed in a binder, and relatively moving the wafer while the conductive material is in contact with the plurality of abrasive composites until the exposed surface of the wafer is substantially planar and comprises at least one area of exposed conductive material and at least one area of exposed dielectric material.

Another method of the invention includes providing a wafer comprising at least one dielectric material having a patterned surface, the dielectric material substantially covered with at least one intermediate layer, and the intermediate layer substantially covered by at least one conductive material, contacting the conductive material of the wafer to a plurality of three-dimensional abrasive composites fixed to an abrasive article in the presence of a working liquid as described herein, wherein the plurality of abrasive composites comprise a plurality of abrasive particles fixed and dispersed in a binder, and relatively moving the wafer while the conductive material is in contact with the plurality of abrasive composites until the exposed surface of the wafer comprises at least one area of exposed conductive material and at least one area of exposed dielectric material.

The methods of the present invention enable one to achieve desirable removal rates for tungsten CMP, while providing low erosion and low dishing. The invention provides substantially planar surfaces, such that the surfaces are flat with respect to the underlying structure, which may be an active region of a wafer.

When practiced, the movement between the wafer and abrasive article occurs under pressure in a range of at least about 0.1 pounds per square inch (psi) (0.7 kiloPascals (kPa)), more preferably at least about 0.2 psi (1.4 kPa). The maximum pressure used is generally below about 25 psi (172 kPa), more preferably below about 15 psi (103 kPa). In one embodiment of this invention, the wafer and abrasive article are rotated and/or moved against each other. For example, the abrasive article or the wafer or both the abrasive article and the wafer are rotated relative to each other as well as being moved linearly along relative centers of the wafer and abrasive article. The wafer and the abrasive article may also be moved in an elliptical or a figure eight type pattern or another desired pattern such that the speed generally varies along the path. The rotational motion or speed of rotation between the wafer and abrasive article may be between 1 rpm (rotation(s) per minute) to 10,000 rpm. Preferred rotational speeds for the abrasive article are when the abrasive article rotates at a speed of at least about 10 rpm, more preferably 20 rpm. Preferred rotational speeds generally are below about 1,000 rpm, and more preferably below about 250 rpm, or even lower, such as below about 120 rpm. Preferred rotational speeds for the wafer are when the wafer rotates at a speed of at least about 2 rpm, more preferably at least about 50 rpm, or even higher such as at least about 100 rpm. Preferred maximum rotational speeds for the wafer generally are below about 1,000 rpm, more preferably below about 500 rpm, and in some embodiments below about 100 rpm. Also, two or more processing conditions within a planarization process may be used. For example, a first processing segment may comprise a higher interface pressure than a second processing segment. Rotation and translational speeds of the wafer and/or the abrasive article also may be varied during the planarization process. Other tools, such as linear motion tools, can be used with correspondingly similar relative motion.

The amount of working liquid used in the CMP process depends on the type and size of wafer being polished, concentration of compounds in the working liquid and the selected CMP polishing tool. Generally, the range of working liquid used (in mL/min) is at least about 5, at least about 50, or even higher such as at least about 80. In other embodiments, the range of working liquid used (in mL/min) is about 1000 or less, below about 400, or even lower, such as below about 250.

In one embodiment, the conductive surface of the wafer is modified by the abrasive article in the presence of a working liquid, which liquid is selected based upon the composition of the wafer surface. In some applications, the working liquid typically includes water (e.g., distilled water, or deionized water).

The working liquid aids processing in combination with the abrasive article through a chemical mechanical polishing process. During the chemical portion of polishing, the working liquid (or a component therein) may react with the outer or exposed wafer surface. Then during the mechanical portion of processing, the abrasive article may remove this reaction product. During the processing of metal surfaces, it is preferred that the working liquid is an aqueous solution which includes a chemical etchant such as an oxidizing agent. For example, chemical polishing of tungsten may occur when an oxidizing agent in the working liquid, by itself or in combination with other additives in the working liquid, reacts with the tungsten to form a surface layer of oxidized tungsten. The mechanical process occurs when the abrasive article removes this oxidized metal from the wafer surface. Alternatively, the metal may first be removed mechanically before reacting with ingredients in the working fluid.

One useful working liquid is an aqueous solution that includes a variety of different additives. Suitable additives include complexing, oxidizing, or passivating agents, metal ions such as transition metal ions, or combinations of additives.

Preferred oxidizing agents that may be incorporated into a working fluid include per-compounds, for example, compounds containing at least one peroxy group (—O—O—). Examples of per-compounds include hydrogen peroxide, persulfate salts of ammonium, sodium and potassium, monopersulfates, organic peroxides such as di-t-butyl peroxide.

Other useful oxidizing agents include; cupric chloride; ferric chloride; chromic-sulfuric acids; potassium ferricyanide; nitric acid, transition metal complexes such as ferricyanide, ammonium ferric EDTA, ferric ammonium citrate, ferric citrate, ammonium ferric oxalate, ferric nitrate, cupric citrate, cupric oxalate, cupric gluconate, cupric glycinate, cupric tartrate, and the like. Other suitable oxidizing agents also include oxo acids of the halogens and their salts, such as the alkali metal salts. These acids are described in Cotton & Wilkinson, Advanced Inorganic Chemistry, 5th Ed. The anions of these acids typically contain halide atoms such as: chlorine, bromine, or iodine. These halides are bonded to one, two, three, or four oxygen atoms. Examples include: chloric acid ($HOClO_2$); chlorous acid ($HOClO$); hypochlorous acid ($HOCl$); and the respective sodium salts thereof, e.g., sodium chlorate, sodium chlorite, and sodium hypochlorite. Similar bromine and iodine analogs are known. Mixtures of oxidizing agents also may be used so long as they do not interfere with the desired results. The concentration of the oxidizing agent in deionized water (in percent by weight of the total fluid without abrasive, even when an abrasive is used) is typically at least about 0.2, at least about 1, or even higher. In other embodiments, this oxidizing agent concentration is below about 50%, below about 30%, or even lower.

The oxidation of and dissolution of the exposed, metal wafer surface can be enhanced by the addition of metal ions to the working liquid. Metals are generally described in Dickerson, Gray and Haight in Chemical Principles, 3rd Ed. Included in the definition of metal are the semi-metals and transition metals. The selection of the metal ion will depend on a variety of factors including the wafer surface to be modified, as well as, the overall composition of the working liquid, particularly the oxidizing agent, with particular selection within the skill of the art when guided with the present disclosure. Generally, it is preferred to have the reduction potential of the metal ion less than the reduction potential of the oxidizing agent and greater than the reduction potential of the metal surface(s) being modified, such that the oxidizing agent may oxidize the metal ion and the metal ion may oxidize the desired wafer surface material followed by re-oxidation of the reduced metal ion by the oxidizing agent. Additionally, it is preferred to use a metal ion of at least an oxidation state of 2+ or higher, such that, upon oxidation of the metal surface(s) by the metal ion, the lowest oxidation state of the reduced metal ion is no lower than 1+. This aspect typically prevents the metal ion from being reduced to a metal solid and precipitating into the working liquid or plating out on the metal surface being modified. Examples of useful metal ions include the ions of Cu, Fe, Ag, Au, Ta, Ti, Ce, Mn, Mg, Sn, Mo, and Sb. The metal ions are typically added to the working liquid by addition of organic and/or inorganic salts containing the corresponding metal ion. Exemplary salts include ferric nitrate, ferric sulfate, ferrous sulfate, ferrous acetate, ferric chloride, cupric chloride, silver acetate and the like. Combinations of metal ions also may be used, so long as the selected combination does not interfere with the desired result. In some embodiments, Group I and Group II metals are not used. Generally, the concentration of the metal ion in the working liquid (in mmol per gram of working liquid, without abrasive, if used) is typically at least about $9 \times 10^{-6}$, $36 \times 10^{-6}$, or even higher. In other embodiments, the concentration of the metal ion in the working liquid (in mmol per gram of working liquid, without abrasive, if used) is typically below about 0.036, below about 0.009, or even lower. In other embodiments, the level of metal ion in the working liquid (in parts per million (ppm) working liquid, without abrasive, if used) is typically at least about 1, 2, 10, 20, 30, 50, or even higher. In other embodiments, this amount is at least about 100, 175, 250, 500, or even higher. In other embodiments, this amount is below about 2,000, below about 1,000, below about 500, or even lower.

The oxidation and dissolution of a metal can be enhanced by the addition of complexing agents: ligands and/or chelating agents for the metal. These compounds can coordinate and/or bond to the metal to increase the solubility of the metal or metal oxides in water as generally described in Comprehensive Coordination Chemistry, Vol. 5, Wilkinson, Gillard, McCleverty, Eds. Complexing agents often are comprised of a carboxyl group(s) or salts thereof. Simple carboxylic acids contain the carboxyl group, —COOH, attached to hydrogen (HCOOH) or an alkyl group (RCOOH). Simple carboxylic acids may have one carboxyl group (i.e., simple monofunctional carboxylic acids) or a plurality of carboxylic acid groups (i.e., simple multifunctional carboxylic acids), e.g., simple difunctional carboxylic acids (i.e., simple dicarboxylic acids) and simple trifunctional carboxylic acids (i.e., simple tricarboxylic acids). Exemplary simple monofunctional carboxylic acids include, e.g., formic, acetic, propionic, butyric, and isobutyric acids. Exemplary simple difunctional carboxylic acids include, e.g., oxalic, malonic, methylmalonic, succinic, glutaric, and adipic acids.

Suitable additives that may be added to or used in the working liquid include monodentate complexing agents, such as ammonia, amines, halides, pseudohalides, carboxylates, thiolates, and the like also called ligands. Other additives that may be added to the working liquid include multidentate complexing agents, typically multidentate amines, and multidentate carboxylic acids. Suitable multidentate amines include ethylenediamine, diethylene-triamine, triethylenetetramine, or combinations thereof. Suitable multidentate carboxylic acids and/or their salts include the simple dicarboxylic acids described above, citric acid, tartaric acid, gluconic acid, nitriloacetic acid, or combinations thereof. Another additive that may be added to the working liquid include hydroxy substituted mono functional carboxylic acids and salts thereof. Exemplary monofunctional hydroxycarboxylic acids include glyceric acid (i.e., 2,3-dihydroxypropanoic acid), glycolic acid, lactic acids (e.g., L-lactic, D-lactic, and DL-lactic acids), hydroxy-butanoic acid, 3-hydroxypropionic acid, methyllactic acid (e.g., 2-hydroxyisobutyric acid) and 3,4-dihydroxybenzoic acid. Combinations of the two monodentate and polydentate complexing agents include amino acids such as glycine, and common analytical chelating agents such as ethylenediaminetetraacetic acid (EDTA) and its numerous analogs. Other useful chelators or complexing agents include, for example, polyphosphates, 1,3-diketones, aminoalcohols, aromatic heterocyclic bases, phenols, aminophenols, oximes, Schiff bases, ascorbic acid and similar structures, and sulfur compounds. Mixtures of the above complexing agents also may be used, so long as they do not interfere with the desired results. The concentration of the complexing agent in deionized water (percent by weight) is typically at least about 0.002, 0.02, or even higher. In other embodiments, this amount is below about 20, below about 10, or even lower.

The complexing agents may also improve solution stability, such as by inhibiting oxidizer decomposition caused by the metal ions in the working liquid. This can be of particular importance if a per-compound, hydrogen peroxide for example, is the oxidizer in the working liquid. When a majority of the complexing agent is selected from a simple monofunctional, a simple difunctional acid, a salt thereof, or a combination thereof, the mole ratio of complexing agent to metal ions (Mc/Mm) present in the composition should be at least 1 to 1, preferably greater than 3 to 1, more preferably greater than 4 or 5 to 1, and in some embodiments greater than 10 to 1. One preferred range is a mole ratio between 15 to 1 and 200 to 1. Other ratios can be used with other acids or salts. The above ratios correspond to a complexing agent that has from one to four complexing sites per molecule. When the number of complexing sites per molecule increases, the ratios should be adjusted correspondingly lower to account for the higher number of complexing sites. If mixtures of complexing agents are used, the ratio of Mc/Mm should be calculated based on the total moles of all complexing agents present. If mixtures of metal ions are used, the ratio of Mc/Mm should be calculated based on the total moles of all metal ions present. A majority of complexing agent includes at least half the total moles of complexing agent used. In some embodiments, at least about 60 mole percent (mol %), 70 mol %, or even more of the simple acid or simple acid salt is used.

Buffers may be added to the working liquid to control the pH and thus mitigate pH changes from minor dilution from rinse water and/or difference in the pH of the deionized water depending on the source. The pH can have a significant effect on the nature of the tungsten surface, and the tungsten removal rate. The most preferred buffers are compatible with semiconductor, post-CMP cleaning needs as well as having reduced potential impurities such as alkali metals. In addition, the presently preferred buffers can be adjusted to span the pH range from acidic to near-neutral to basic. Polyprotic acids act as buffers, and when fully or partially neutralized with ammonium hydroxide to make ammonium salts, they are representative examples including systems of phosphoric acid-ammonium phosphate; polyphosphoric acid-ammonium polyphosphate; the boric acid-ammonium tetraborate; boric acid-ammonium pentaborate. Other suitable buffers comprise an organic acid and its corresponding salt, particularly the ammonium salt. Tri- and polyprotic protolytes and their salts, especially the ammonium salts are preferred. These may include ammonium ion buffer systems based on the following protolytes, all of which have at least one pKa greater than 7: aspartic acid, glutamic acid, histidine, lysine, arginine, ornithine, cysteine, tyrosine, and carnosine.

Corrosion inhibitors for metals are known. For example, typical inhibitors for copper include benzotriazole and its derivatives known as azole derivatives, such as tolyltriazole. Copper is known to be somewhat passivated by cuprous oxide, especially at neutral or mildly alkaline pH. In addition, phosphates are known in passivating agents, such as used in coatings for zinc and steel. Including a passivating agent in the CMP working fluid can protect areas of a metal surface not yet in contact with the abrasive from premature, or excessive removal by an etchant or control how much oxidizing agent reacts with the exposed metal surface. An example of a passivating agent is benzotriazole. Other passivating agents are listed in Leidheiser, The Corrosion of Coppers, Tin, and Their Alloys, (1971), pp. 119-123. The amount and type of passivating agent will depend in part of the desired planarization criteria (e.g., cut rate, surface finish, and planarity). Passivating agents, or etching inhibitors, useful with tungsten include 4-ethyl-2-oxazoline-4-methanol, 2,3,5-trimethylpyrazine, 2-ethyl-3,5-dimethylpyrazine, quinoxaline, pyridazine, pyrazine, glutathione (reduced), thiophene, mercaptopyridine n-oxide, thiamine hydrochloride, tetraethyl thiuram disulfide.

The working liquid may also contain other additives such as surfactants, wetting agents, buffers, lubricants, soaps, and the like. These additives are chosen to provide the desired benefit without damaging the underlying semiconductor wafer surface. For example, a lubricant may be included in the working liquid in a fixed abrasive process to reduce friction between the abrasive article and the semiconductor wafer surface during planarization.

Inorganic particulates may also be included in the working liquid. These inorganic particulates may aid in the cut rate. Examples of such inorganic particulates include: alumina, silica, zirconia, calcium carbonate, chromia, ceria, cerium salts (e.g., cerium nitrate), garnet, silicates, and titanium dioxide. The average particle size of these inorganic particulates should be less than about 1,000 Angstroms, preferably less than about 500 Angstroms, and more preferably less than about 250 Angstroms.

Although particulates may be added to the working liquid, the presently preferred working liquid is substantially free of inorganic particulates, e.g., loose abrasive particles which are not associated with the abrasive article. Preferably, the working liquid contains less than 1% by weight, preferably less than 0.1% by weight and in some embodiments more preferably 0% by weight inorganic particulates.

In some embodiments, the invention provides a chemical mechanical polishing system comprising a fixed abrasive pad and a polishing composition useful for modifying a surface of a wafer, the composition comprising a synergistic mixture of water; an oxidizing agent; a complexing agent; and metal ions; wherein when the complexing agent is a simple monofunctional or simple difunctional acid or salt thereof, the mole ratio of complexing agent to metal ions present in the liquid is at least 3 to 1; and wherein the mixture is substantially free of abrasive particles. In some aspects, this system is supplied as a kit or multi-component system with or without instructions for use, and it can be provided such that the oxidizing agent remains separate from the metal ions and the fixed abrasive pad until the day or time of use or until the polishing operation requires the composition.

The nature of the metal surface in contact with a solution is related to the pH of the solution as well as the electrochemical potential of the metal. For example at pH greater than about 4, tungsten tends to corrode. At a pH<4, a self-passivating tungsten oxide coating is formed. Thus, the pH of the polishing solution can be important. For tungsten polishing, it is preferred to have a pH from about 0.5 to 7, more preferably at least about 1, or at least about 1.5. In other embodiments, a preferred pH is below about 5, below about 3 or even lower. The nature of the surface being modified, e.g., metal or metal oxide, also can have a significant effect on the action of the abrasive pad. Thus, the CMP polishing system, i.e., the polishing pad and polishing solution, must be optimized together to obtain the most desirable results. If a fixed abrasive pad is used, selection of the abrasive particle may be dependent on the nature of the polishing solution, for example the solution pH. Generally, it is desirable for the fixed abrasive polishing pad to be stable in aqueous solutions, i.e., to be comprised of polymers resistant to swelling by water or hydrophobic, and to be stable to the polishing solution to maximize pad life.

The amount of the working liquid preferably is sufficient to aid in the removal of metal or metal oxide deposits from the surface. In many embodiments, there is sufficient liquid from the basic working liquid and/or the chemical etchant. In other embodiments, it is preferred to have a second liquid present at the planarization interface in addition to the first working liquid. This second liquid can include components also used in the first liquid, and it can be entirely different.

Commercially available tungsten slurries, with the abrasive particles removed, are believed to be useful as a substantially abrasive free polishing solution for tungsten CMP with fixed abrasive polishing pads. Examples of such slurries include Microplanar® CMP3550™, CMP3510™, CMP3100™, CMP3010™, and CMP3005™ from EKC technology, DuPont Electronic Technologies; Semi-Sperse® W2000 and W2585 from Cabot Microelectronics Corp.; and MSW1500 Series Slurries and MSW2000 Series Slurries from Rohm and Haas Electronic Materials. Such slurries may be, or may become, available with few or no abrasive particles. Or, one can remove the abrasive particles from the commercial slurry via any known method. One such method is filtering the slurry, such as via the method described below in the Examples. In another embodiment, such a slurry liquid base can be modified or fortified by adding selected working fluid components as described above.

Generally, it is preferred that the polishing solution oxidizes tungsten at a reasonable rate. Although a preferred method for Fixed Abrasive (FA) tungsten CMP is to have a substantially abrasive free polishing solution, it is believed that small quantities of an appropriate abrasive could be added to the abrasive free polishing fluid, or left in the fluid when removing much of the abrasive, while obtaining useful results.

Using the FA approach in other CMP systems provides low dishing and low erosion. Both results have been demonstrated using FA tungsten CMP as well. Tungsten removal rates of up to 5,000 Å/min can be obtained, depending on process conditions (see the Examples below for further guidance). The removal rates are well within the range of those required for acceptable wafer throughput. Additionally, when pattern STI wafers containing both silicon oxide and silicon nitride regions were polished under the identical polishing conditions using a FA pad along with an exemplary working fluid, silicon oxide and silicon nitride removal rates were both about 2 Å/min, yielding very high tungsten/silicon oxide and tungsten/silicon nitride ratios. Although Ti and TiN rates were not specifically measured in this experiment, the FA approach rapidly removed the Ti/TiN layer as determined from the tungsten thickness and total polish time.

This invention is useful in semiconductor wafer planarization involving fixed abrasive articles. Objects and advantages of this invention are further illustrated by the following examples, but the particular materials and amounts thereof recited in these examples, as well as other conditions and details, should not be construed to unduly limit this invention.

EXAMPLES

Hydrogen peroxide, described as 30% by weight in water, CMOS™, stabilized, and ferric ammonium citrate (green) were obtained from J. T. Baker (a division of Mallinckrodt Baker, Inc. Phillipsburg, N.J.), and where not otherwise specified, materials are available from chemical supply houses, such as Sigma-Aldrich, Inc., St. Louis, Mo.

Materials

Fixed Abrasives

Copper (Cu) CMP fixed abrasive discs available as M6100 (MWR66) and MWR131 from the 3M Company (St. Paul, Minn.) were used. Both fixed abrasives had a "T63" geometry, a three-dimensional fixed abrasive having three-sided pyramids having a height of about 63 µm and each side, although not being identical, having a length of about 125 µm, and included alumina abrasive. The fixed abrasive sheets were laminated to 20/90 sub-pads (a foam sheet on a polycarbonate sheet available from 3M Company) using a pressure-sensitive adhesive (available as 9671 from 3M).

Wafers

Eight inch (200 mm) diameter, blanket tungsten wafers, were obtained from Ramco Technology, Inc. (Los Altos, Calif.). The wafers were single crystal silicon coated with the following layers in order from the surface of the silicon: about 500 nm (5,000 Å) tetraethylorthosilicate (TEOS), about 15 nm (150 Å) titanium, about 10 nm (100 Å) titanium nitride, and about 800 nm (8,000 Å) cvd tungsten. Additional wafers of similar build were obtained from the Cypress Semiconductor Corp. (San Jose, Calif.). Eight inch diameter (200 mm) tungsten pattern wafers with an MIT 854 type mask without dummy structures were purchased from Ramco Technology. The pattern wafers had the following wafer layers: 400 nm (4,000 Å) PETEOS, about 15 nm (150 Å) titanium, about 10 nm (100 Å) titanium nitride, and about 600 nm (6,000 Å) CVD tungsten.

Polishing Solutions

A quantity of deionized (DI) water was mixed with other ingredients (as specified in each Example), by stirring the solution with a Teflon-coated magnetic stir bar until complete dissolution was observed.

Test Procedures

Removal Rate determination

Removal rate was calculated by determining the change in thickness of the layer being polished from the initial thickness and the final thickness. For eight inch diameter wafers, thickness measurements were taken with a ResMap 168-4 point probe R5 Mapping Tool (Credence Design Engineering, Inc., Cupertino, Calif.). Eighty-one point diameter scans with 5 mm edge exclusion were employed.

Wafer Non-Uniformity Determination

Percent wafer non-uniformity was determined by calculating the standard deviation of the change in thickness of the layer being polished at points on the surface of the wafer (as obtained from the Removal Rate Determination), dividing the standard deviation by the average of the changes in thickness of the layer being polished, and multiplying the value obtained by 100 so results are reported as percentage.

Hydrogen Peroxide Concentration Determination

Hydrogen peroxide concentration was determined by use of peroxide test strips (EM Quant® Peroxide test strips manufactured by EM Science, a Division of EM Industries, Inc., Gibbstown, N.J.). The general test procedure described on the test strip container was employed. When applicable, the working liquids were diluted with DI water to the appropriate concentration range detectible by the test strips. The dilution factor was then taken into account to determine the amount of hydrogen peroxide present in the sample.

General Polishing Procedure

Wafers were polished using a MIRRA 3400 Chemical-Mechanical Polishing System (Applied Materials, Inc., Santa Clara, Calif.) or an Ebara Model EPO112 CMP Tool (Ebara Technologies, Inc., Sacramento, Calif.). For Mirra polishing, a polishing pad, 20 inches in diameter (50.8 cm), was laminated to the platen of the polishing tool with a layer of PSA as described above. The pad was high pressure rinsed with deionized (DI) water for 10 seconds and conditioned by polishing wafer(s) for 3-8 minutes at a platen speed of 101 rpm, a carrier speed of 99 rpm, and a polishing solution flow rate of 120 mL/min. During this polish, the pressures applied to the TITAN carrier inner tube, retaining ring and membrane were 31.0 kilopascals (kPa) (4.5 psi), 34.5 kPa (5.0 psi), 31.0 kPa (4.5 psi), respectively. Pad break-in was conducted with either CPS-11 polishing solution (available from 3M Company) containing the recommended level of hydrogen peroxide and an eight-inch diameter Cu disc or a blanket tungsten wafer(s) and any one of the documented tungsten polishing solutions. After pad break-in, polishing was conducted at a solution flow rate of 150 mL/min for 60 seconds per wafer.

Unless otherwise noted in the specific example, process conditions for tungsten wafer polishing were as follows: membrane pressure 27.6 kPa (4.0 psi), retaining ring pressure 34.5 kPa (5.0 psi), inner tube pressure 41.4 kPa (6.0 psi), platen speed 79 rpm, carrier speed 101 rpm using a slotted retaining ring and polishing solution delivery arm in the lock position with an MWR66 polishing pad. Comparative Examples CE-1 through CE-6 and Examples 1 through 6 were polished on the Mirra 3400.

For EPO112 polishing, a MWR66 polishing pad, 22.5" diameter, was laminated to the platen of the polishing tool with a layer of PSA as described above. The pad was rinsed with deionized (DI) water for 10 seconds. Pad break-in was conducted by polishing 8 tungsten blanket wafers for 1 minute each at a platen speed of 79 rpm, a carrier speed of 101 rpm, a top ring pressure of 41.4 kPa (6.0 psi), a back side pressure of 27.6 kPa (4.0 psi) and a polishing solution flow rate of 150 mL/min. The break-in polishing solution contained 95.854% DI water, 4.066% hydrogen peroxide and 0.080% ferric ammonium citrate (green). After pad break-in, process conditions for all tungsten wafer polishing examples were as follows: top ring pressure 27.6 kPa (4.0 psi), back side pressure 17.3 kPa (2.0 psi), platen speed 79 rpm, carrier speed 101 rpm with a solution flow rate of 195 mL/min. The polishing time was 1 minute for blanket wafers and 2 minutes for pattern wafers. Comparative Examples CE-7 through CE-11 and Examples 7 through 10 were polished using this method.

Key polishing solution parameters and tungsten blanket wafer polishing results are summarized in Table 1 including: polishing solution metal ion concentration, ratio of moles of complexing agent to moles of metal ion in the polishing solution (Mc/Mm), hydrogen peroxide concentration, tungsten wafer removal rate and wafer non-uniformity.

Example 1

Polishing Solution: 856.5 g DI water, 7.9 g ferric ammonium citrate (green), 135.7 g 30% (wt.) hydrogen peroxide. The pH was 4.5. For samples containing ferric ammonium citrate (green), the moles of metal ion present were calculated based on a weight fraction of iron in the compound of 0.15. For the Table below, the moles of complexing agent present were calculated based on the assumption that the weight fraction of citrate ion present was 0.85. Hence, it represents the maximum possible amount of organic complexing agent present. The value could be somewhat lower, depending on the amount of ammonium ion in the compound.

Example 2

Polishing Solution: 859.5 g DI water, 5.0 g of a solution comprised of 6.66 g ferric ammonium citrate (green) and 993.34 g DI Water, 135.5 g 30% (wt.) hydrogen peroxide.

Example 3

Polishing Solution: 1,863.7 g DI water, 0.80 g ferric ammonium citrate (green), 135.5 g 30% (wt.) hydrogen peroxide. The pH was 4.8.

Example 4

Polishing Solution: 1,592.7 g DI water, 0.80 g ferric ammonium citrate (green), 406.5 g 30% (wt.) hydrogen peroxide. The pH was 4.9.

Example 5

Polishing Solution: 1,626.8 g DI water, 2.23 g 2-hydroxyisobutyric acid, 100 g of a solution comprised of 1,997.6 g DI water and 2.38 g ferrous sulfate hydrate, 271 g 30% (wt.) hydrogen peroxide. The pH was 2.82.

Example 6

Polishing Solution: 3,452.9 g DI water, 0.52 g iron (III) nitrate nonahydrate, 4.46 g 2-hydroxyisobutyric acid, 542 g 30% (wt.) hydrogen peroxide. The pH was 2.67.

Comparative Example CE-1

Polishing Solution: 25 g citric acid, 2,000 g 30% (wt.) hydrogen peroxide. Polishing Pad: MWR131. Process Conditions: membrane pressure 31.0 kPa (4.5 psi), retaining ring pressure 62.1 kPa (9.0 psi), inner tube pressure 62.1 kPa (9.0 psi), platen speed 101 rpm, carrier speed 99 rpm. Process Configuration: Slotted retaining ring, polishing solution delivery arm in pad center (solution is delivered onto the pad approx. 1.25-2.5 cm (0.5-1.0 inch) from pad center). This example shows that high levels of hydrogen peroxide are necessary to obtain acceptable removal rates when other components of the invention are absent.

Comparative Example CE-2

Polishing Solution: 2,850 g DI water, 150 g iron (III) nitrate nonahydrate. The pH was 1.55.

Comparative Example CE-3

Polishing Solution: 1863.5 g DI water, 1.45 g iron (III) nitrate nonahydrate, 135 g 30% (wt.) hydrogen peroxide. The pH was 2.71. However, the rapid decomposition of the hydrogen peroxide prevented tungsten wafer polishing.

Comparative Example CE-4

Polishing Solution: 3,500 g DI water, 538.5 g 30% (wt.) hydrogen peroxide.

Comparative Example CE-5

Polishing Solution: 922.5 g DI water, 7.9 g ferric ammonium citrate (green). The pH was 4.6.

Comparative Example CE-6

Polishing Solution: 856 g DI water, 3.74 g iron (II) acetate anhydrous (CAS #3094-87-9 from Alfa Aesar, Karlsruhe, Germany), 135.5 g 30% (wt.) hydrogen peroxide. The pH was 3.49. However, the rapid decomposition of the hydrogen peroxide prevented tungsten wafer polishing.

Comparative Example CE-7

Polishing Solution: 1730.3 g DI water, 271 g 30% (wt.) hydrogen peroxide, with pH 5.46.

Comparative Example CE-8

Polishing Solution: 1719.8 g DI water, 9.25 g 2-hydroxyisobutyric acid, 271 g 30% (wt.) hydrogen peroxide. The pH was 2.59.

Comparative Example CE-9

Polishing Solution: 1990.4 g DI water, 0.40 g iron (III) nitrate nonahydrate, 9.25 g 2-hydroxyisobutyric acid. The pH was 2.55.

Example 7

Polishing Solution: 6,916 g of a solution comprising; 13,754.8 g DI water, 3.2 g iron (III) nitrate nonahydrate and 74.0 g 2-hydroxyisobutyric acid. 1,084 g 30% (wt.) hydrogen peroxide was then added to the 6,916 g of metal ion containing solution. The pH was 2.47.

Comparative Example CE-10

Polishing Solution: 1726.4 g DI water, 1.45 g iron (III) nitrate nonahydrate, 0.42 g methylmalonic acid, 271 g 30% (wt.) hydrogen peroxide. The solution pH was 2.40. The hydrogen peroxide decomposed too rapidly to allowing tungsten wafer polishing. One day later, the hydrogen peroxide concentration of the solution was 0 mg/L, as indicated by peroxide strips.

Comparative Example CE-11

Polishing Solution: 1726.8 g DI water, 1.45 g iron (III) nitrate nonahydrate, 0.80 g methylmalonic acid, 271 g 30% (wt.) hydrogen peroxide. The solution pH was 2.29. Two days later, the hydrogen peroxide concentration of the solution was 2 mg/L, as indicated by peroxide strips.

Example 8

Polishing Solution: 1726.0 g DI water, 1.45 g iron (III) nitrate nonahydrate, 1.60 g methylmalonic acid, 271 g 30% (wt.) hydrogen peroxide. The solution pH was 2.20. Two days later, the hydrogen peroxide concentration of the solution was about 30 g/L (approximately 3%), as indicated by peroxide strips.

Example 9

Polishing Solution: 3452.7 g DI water, 0.80 g iron (III) nitrate nonahydrate, 4.46 g 2-hydroxyisobutyric acid, 542 g 30% (wt.) hydrogen peroxide. The solution pH was 2.57. A blanket tungsten wafer, a pattern tungsten wafer, and an STI pattern wafer, were polished. Removal rate for the blanket wafer is shown in Table 1. The pattern wafer was clear after a two-minute polish, including the Ti and TiN layers. Dishing and erosion were good. A 90% dense array (9 μm Line/1 μm Space), 100 μm (isolated line) and a 10 μm line (array) yielded total indicated runout (TIR) values of 569 Å, 476 Å, and 369 Å, respectively. The pattern STI wafers was polished for two minutes. Oxide loss was 2 Å/min and nitride loss was also 2 Å/min. Hence, there is a high selectivity to tungsten.

Example 10

Polishing Solution; Identical composition as Example 9. The solution was allowed to age 4 days prior to polishing. The solution pH was 2.52. A blanket tungsten wafer and a patterned tungsten wafer were polished. Removal rate for the blanket wafer is shown in Table 1. The patterned wafer was clear after the first two minute polish, including the Ti and TiN layers. Dishing and erosion were good. A 90% dense array (9 μm Line/1 μm Space), 100 μm (isolated line) and a 10 μm line (array) yielded TIRs of 550 Å, 476 Å, and 341 Å, respectively. Comparing to the results of Example 9, the polishing solution shows excellent pot life after hydrogen peroxide addition, with little hydrogen peroxide decomposition observed as indicated by the absence of significant gas bubble formation.

Comparative Example CE-12

Polishing Solution: 1728.9 g DI water, 0.14 g iron (M) nitrate nonahydrate, 346 g 30% (wt.) hydrogen peroxide. Decomposition of the hydrogen peroxide prevented tungsten wafer polishing.

TABLE 1

Polishing Solution Parameters and Tungsten Removal Results

| Example | Metal Ion Conc. (ppm) | Mc/Mm | $H_2O_2$ Conc. (wt %) | Removal Rate (Å/min.) | % Non-Uniformity |
|---|---|---|---|---|---|
| 1 | 1180 | 1.6 | 4.07 | 2,410 | 3.9 |
| 2 | 5 | 1.6 | 4.06 | 2,396 | 17.9 |
| 3 | 60 | 1.6 | 2.03 | 1,508 | 13.2 |
| 4 | 60 | 1.6 | 6.10 | 2,965 | 7.4 |
| 5 | 12.0 | 50.0 | 4.06 | 2,256 | 6.1 |
| 6 | 18.0 | 33.3 | 4.06 | 1,518 | 6.9 |
| CE-1 | 0.0 | NA | 29.6 | 1,912 | 15.3 |
| CE-2 | 6,910 | NA | 0.0 | 1,219 | 7.7 |
| CE-3 | 100 | 0.0 | 2.03 | NA | NA |
| CE-4 | 0.0 | NA | 4.00 | 147 | 25.3 |
| CE-5 | 1180 | 1.6 | 0.00 | 96 | 38.6 |
| CE-6 | 1200 | 1.0 | 4.06 | NA | NA |
| CE-7 | 0.0 | 0.0 | 4.06 | 440 | 59.1 |
| CE-8 | 0.0 | NA | 4.06 | 705 | 23.2 |
| CE-9 | 27.6 | 89.7 | 0.00 | 23 | NA |
| 7 | 27.6 | 89.7 | 4.06 | 2,745 | 9.3 |
| 8 | 100 | 3.8 | 4.06 | 3,127 | 8.9 |
| CE-10 | 100 | 1.0 | 4.06 | NA | NA |
| CE-11 | 100 | 1.9 | 4.06 | 2,789 | 11.6 |
| 9 | 27.5 | 90 | 4.05 | 2,945 | 9.4 |
| 10 | 27.5 | 90 | 4.05 | 3,355 | 8.7 |
| CE-12 | 9.3 | 0.0 | 5.00 | NA | NA |

It is apparent from the above description that various modifications can be made without departing from the invention. Accordingly, the scope of the invention should be limited only by the appended claims. All publications and patents are herein incorporated by reference to the same extent as if each individual publication or patent was specifically and individually indicated to be incorporated by reference.

What is claimed is:

1. A chemical mechanical polishing composition useful for modifying a surface of a wafer with a fixed abrasive, the composition comprising a synergistic homogeneous mixture of water; an oxidizing agent; a complexing agent; and metal ions; wherein a majority of the complexing agent is selected from a simple monofunctional acid, a simple difunctional acid, a salt thereof, or a combination thereof, the mole ratio of complexing agent to metal ions present in the composition is at least 3 to 1; and wherein the mixture is substantially free of abrasive particles.

2. The polishing composition of claim 1 wherein a majority of the complexing agent is a simple monofunctional acid, a simple difunctional acid, a salt thereof, or a combination thereof, the mole ratio of complexing agent to metal ions present in the liquid is at least 4 to 1.

3. The polishing composition of claim 1 wherein the mixture is substantially free of a passivating agent.

4. The polishing composition of claim 1 wherein the complexing agent is multi-dentate.

5. The polishing composition of claim 1 wherein the metal ion is an ion of a metal selected from Cu, Fe, Ag, Au, Ta, Ti, Ce, Mn, Mg, Sn, Mo, Sb, and combinations thereof.

6. The polishing composition of claim 1 wherein the metal ion is an ion of Fe and/or Mn.

7. The polishing composition of claim 1 wherein the complexing agent is selected from citric acid, 2-hydroxyisobutyric acid, lactic acid, oxalic, malonic acid, methylmalonic acid, succinic acid, glutaric acid, and adipic acid, their corresponding salts and mixtures thereof.

8. The polishing composition of claim 1 wherein the oxidizing agent is at least one per-compound.

9. The polishing composition of claim 1 wherein the oxidizing agent is hydrogen peroxide.

* * * * *

UNITED STATES PATENT AND TRADEMARK OFFICE
CERTIFICATE OF CORRECTION

PATENT NO. : 7,435,162 B2  Page 1 of 1
APPLICATION NO. : 11/256736
DATED : October 14, 2008
INVENTOR(S) : Jeffrey S. Kollodge It is certified that error appears in the above-identified patent and that said Letters Patent is hereby corrected as shown below:

First page (56)
OTHER PUBLICATIONS, insert --Guthrie et al., "Chemical-Mechanical Polishing To Planarize Blanket and Selective CVD Tungsten:, pages 527-533, Materials Research Society 1992--

Column 9
Line 40, delete "camosine" and insert --carnosine--

Column 12
Line 26, delete "R5" and insert --Rs--

Column 16
Line 9, delete "(M)" and insert --(III)--

Signed and Sealed this

Second Day of June, 2009

JOHN DOLL
*Acting Director of the United States Patent and Trademark Office*